United States Patent
Lamesch et al.

(10) Patent No.: US 6,180,877 B1
(45) Date of Patent: *Jan. 30, 2001

(54) ELECTRICAL CONDUCTOR PROTECTED AGAINST ELECTROMAGNETIC INTERFERENCE EXCEEDING A THRESHOLD

(75) Inventors: Stéphane Lamesch, La Garenne Colombes; Jean-Louis Braut, Chatou; Alain Le Mehaute, Gif sur Yvette; Denis Cottevieille, Montreuil Sous Bois, all of (FR)

(73) Assignee: Thomson-CSF Communications, Paris (FR)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/925,725

(22) Filed: Sep. 9, 1997

(30) Foreign Application Priority Data

Sep. 9, 1996 (FR) .................................................. 96 10962

(51) Int. Cl.$^7$ .................................................... H01B 17/16
(52) U.S. Cl. .............................................. 174/36; 174/28
(58) Field of Search ................... 174/28, 36, 102 SC; 333/243, 245

(56) References Cited

U.S. PATENT DOCUMENTS

| | | | | |
|---|---|---|---|---|
| 2,997,519 | * | 8/1961 | Hines et al. .............................. | 174/28 |
| 3,315,025 | * | 4/1967 | Tomlinson ............................ | 174/107 |
| 3,568,111 | * | 3/1971 | Dyer ........................................ | 333/97 |
| 3,711,794 | | 1/1973 | Tasca et al. ............................. | 333/96 |
| 3,912,850 | * | 10/1975 | Bruno et al. ............................ | 174/28 |
| 4,304,713 | * | 12/1981 | Perelman ............................... | 264/174 |
| 4,556,860 | * | 12/1985 | Tobias et al. ........................... | 338/22 |
| 4,565,594 | * | 1/1986 | Kuettner ............................ | 174/102 R |
| 4,758,685 | * | 7/1988 | Pote et al. ............................... | 174/29 |
| 4,841,259 | * | 6/1989 | Mayer ................................... | 333/17.2 |
| 5,132,490 | * | 7/1992 | Aldissi .................................... | 174/36 |
| 5,416,155 | * | 5/1995 | Aladenize et al. .................... | 524/495 |
| 5,463,014 | * | 10/1995 | Epstein et al. ......................... | 528/210 |
| 5,516,983 | * | 5/1996 | Kishimoto et al. ....................... | 174/1 |
| 5,530,206 | * | 6/1996 | Robert et al. .................. | 174/102 SC |

FOREIGN PATENT DOCUMENTS

0264315A1   4/1988  (EP) .

OTHER PUBLICATIONS

E. Costamagna et al, "Characteristic Impedances of Coaxial Structures of Various Cross Section by Conformal Mapping", *IEEE Transactions on Microwave Theory and Techniques*, vol. 39, No. 6 Jun. 1, 1991 pp. 1040–1043.

8099 IEEE Transactions on Microwave Theory and Techniques, Jun. 1991, pp. 1–4.*

* cited by examiner

*Primary Examiner*—Kristine Kincaid
*Assistant Examiner*—William H. Mayo, III
(74) *Attorney, Agent, or Firm*—Sughrue, Mion, Zinn, Macpeak & Seas, PLLC

(57) ABSTRACT

A device for transmitting electrical energy or electrical signals comprises a core, an outer conductor and a threshold characteristic dielectric material between the core and the outer conductor. The dielectric material comprises, at least in part, a material that is insulative if the electric field is below a particular threshold and conductive when the electric field exceeds a particular threshold, so as to prevent the transmission of signals for which the electric field is above the threshold. The configuration of the core and/or of the outer conductor is such that the external electric field threshold from which the material becomes conductive is significantly less than the intrinsic breakdown threshold of the material.

14 Claims, 4 Drawing Sheets

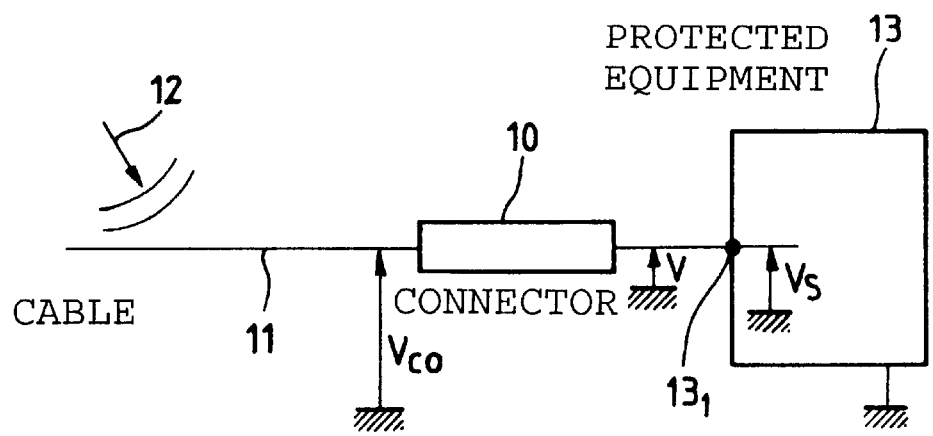
FIG_1
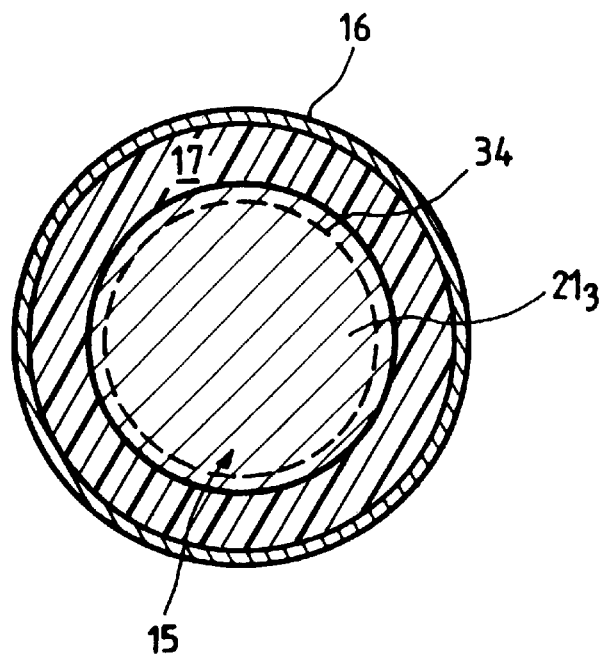
FIG_3

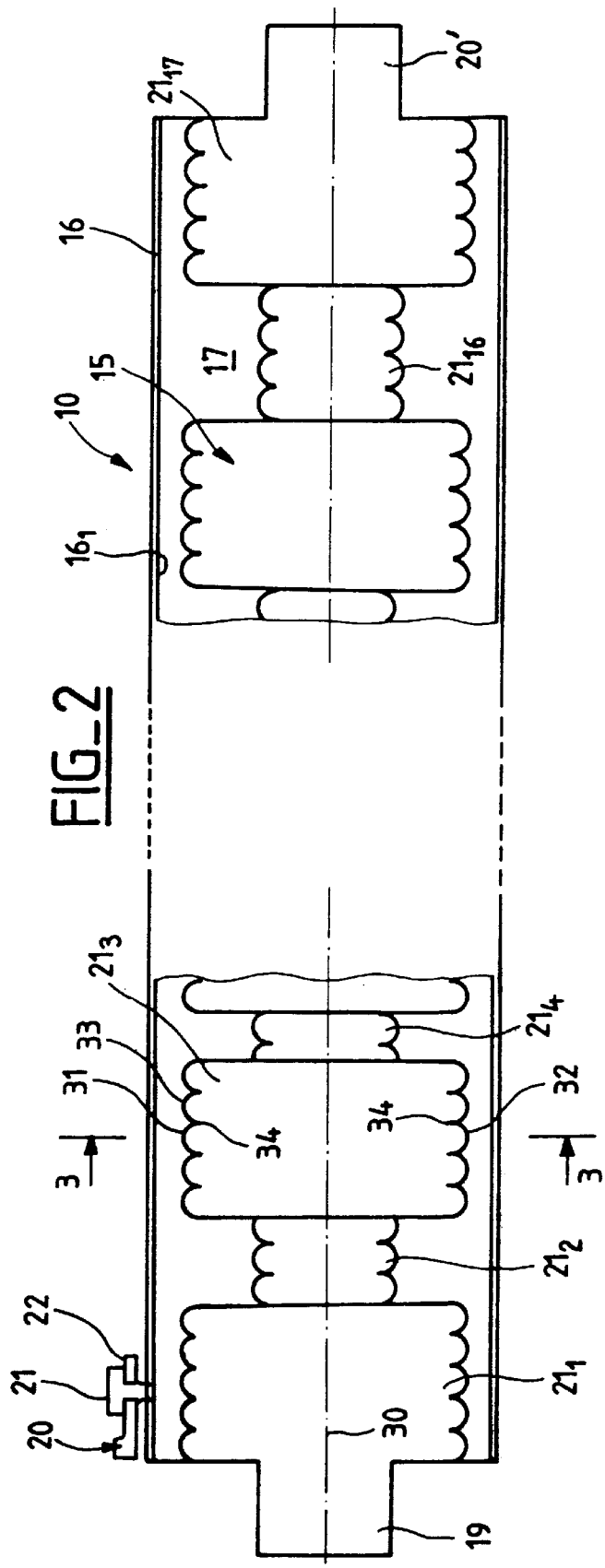
FIG_2
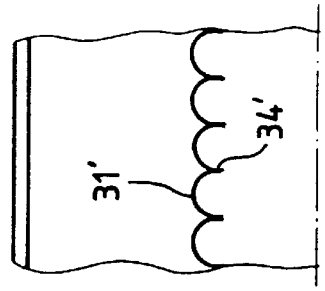
FIG_4

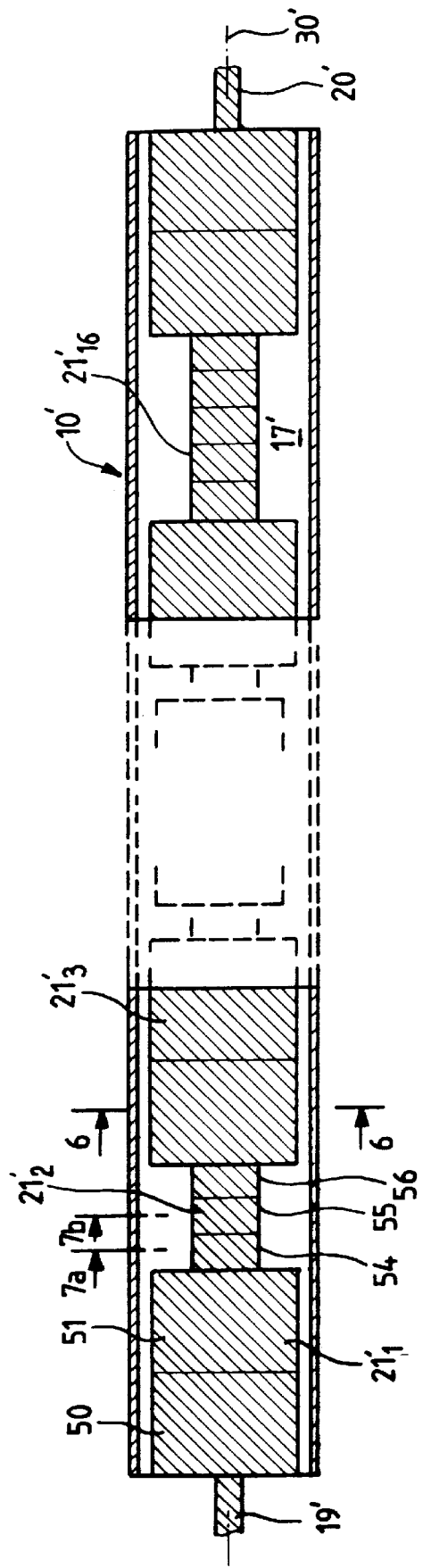
FIG_5

FIG_6
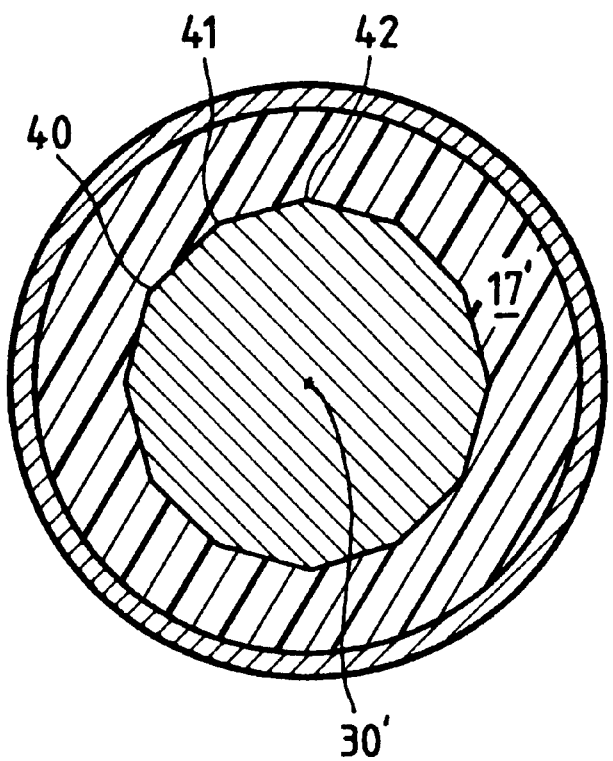
FIG_7a
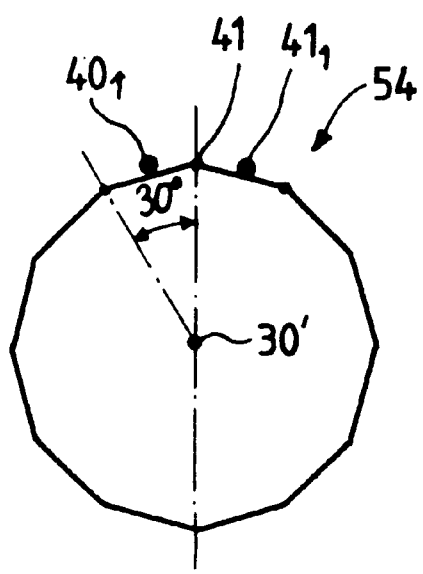
FIG_7b
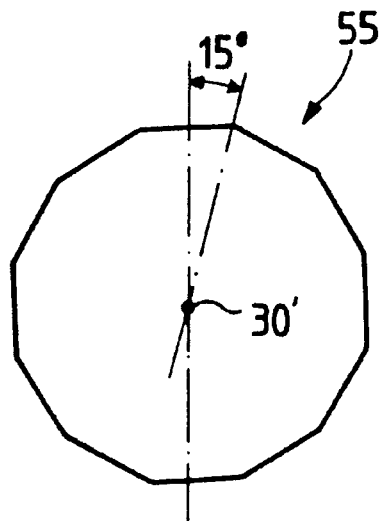

ELECTRICAL CONDUCTOR PROTECTED AGAINST ELECTROMAGNETIC INTERFERENCE EXCEEDING A THRESHOLD

BACKGROUND OF THE INVENTION

1. Field of the Invention

The invention concerns a conductor protected against electromagnetic interference.

2. Description of the Prior Art

Conductors or cables for transmission of electrical power or electrical signals can carry electromagnetic interference that can damage the equipment (transmitter and/or receiver) to which the cable or conductor is connected.

The interference can be of many different kinds with varying frequencies and amplitudes.

The most meaningful example is lightning which consists in electrical energy of great amplitude and extending over a wide frequency spectrum. Also, the intensification of telecommunications is increasing stray electromagnetic fields. These fields are produced by various sources such as radio and television transmitters, telephone communications or radar transmissions. The interference can also originate from the electrical power distribution network. It may also be in the form of intentional jamming.

Whatever the source of the pollution, the stray fields are often detected by the cables acting as receive antennas.

Various types of protection have routinely been used until now to combat such interference. An outer conductor forming a Faraday cage is commonly employed to protect cables against external radiated interference. Apparatus and equipment is protected against interference carried by a cable or a conductor by means of a filter at the input of the apparatus or equipment, the filter incorporating inductors, capacitors and diodes. The most frequently employed form of lightning protection is a lightning arrester or surge arrester, or a varistor shunting the conductor to be protected. A varistor is a component having an electrical resistance which is greatly reduced if the electric field exceeds a particular threshold; in this case, the interference is shunted to ground.

A cable having a dielectric material with a non-linear characteristic or a threshold characteristic between the core and the outer conductor has also been proposed.

All these protection means or devices are relatively complex, bulky and costly. Moreover, the threshold of the non-linear materials that can be used is generally too high to protect electronic equipment.

The invention remedies these drawbacks.

SUMMARY OF THE INVENTION

The invention consists in a device for transmitting electrical energy or electrical signals comprising a core, an outer conductor and a threshold characteristic dielectric material between said core and said outer conductor, wherein said dielectric material comprises, at least in part, a material that is insulative if the electric field is below a particular threshold and conductive when the electric field exceeds this threshold, so as to prevent the transmission of signals for which the electric field is above said threshold, and the configuration of said core and/or of said outer conductor is such that the external electric field threshold from which said material becomes conductive is significantly less than the intrinsic triggering threshold of said material.

The "spike effect", i.e. the local increase in the electric field in the vicinity of a conductive surface having a small radius of curvature, is preferably used to achieve this result. The factor by which the breakdown threshold is divided is between 10 and 100, for example.

This greatly facilitates the choice of the threshold characteristic material.

In one example of use of the spike effect mentioned above, the core and/or the outer conductor have corrugations with a small radius of curvature. In other words, in cross-section on a plane passing through its axis, the core has ribs. It is the radius of curvature of each corrugation that determines the factor by which the threshold is divided. If two corrugations join at an edge, the latter can contribute to the spike effect, despite its greater distance from the outer conductor. As an alternative, the core has spiral edges, like a screwthread.

In another example, the core has a polygonal cross-section. The vertices of the polygon are the edges that generate the spike effect.

In this latter embodiment, it is preferable to provide a plurality of successive sections in the longitudinal direction that are identical to each other but offset by a particular angle about the longitudinal axis, so as to homogenize the distribution of the "spikes", i.e. the places where the electric field is locally increased. For example, if the cross-section is a polygon with n sides, each of which subtends an angle steel at the center of $360°/n$, the angular offset between two prismatic (or polygonal cross-section cylindrical) sections will advantageously be equal to $360°/2n$.

The threshold characteristic material is disposed between the core and the conductor either alone or in combination with at least one other dielectric material.

The conductor constitutes, for example, a connector between a conventional cable and equipment for receiving and/or transmitting signals transmitted by the cable.

In another application, the threshold characteristic material constitutes at least one separator member between the core and the outer conductor of a cable for transmitting power or electrical signals.

The threshold characteristic material is preferably an organic material such as a conductive polymer or a zwitterion. By "conductive" polymer is meant a polymer which, whilst being insulative under normal conditions, nevertheless has a conductivity higher than that of a conventional insulator. For example, a conventional insulator such as polyethylene has a conductivity of $10^{-15}$ S/cm whereas a conductive polymer such as polyaniline has a conductivity of $10^{-10}$ S/cm.

Other features and advantages of the invention will emerge from the description of some embodiments of the invention given with reference to the accompanying drawings.

BRIEF DESCRIPTION OF THE DRAWINGS

FIG. 1 is a block schematic of one example of use of a connector in accordance with the invention.

FIG. 2 is a schematic longitudinal section of one embodiment of a connector in accordance with the invention.

FIG. 3 is a section taken along the line 3—3 in FIG. 2.

FIG. 4 shows schematically and to a larger scale part of the device shown in FIG. 2.

FIG. 5 is a schematic similar to that of FIG. 2, but for a variant.

FIG. 6 is a section taken along the line 6—6 in FIG. 5.

FIGS. 7a and 7b are sections taken along the lines 7a and 7b, respectively, in FIG. 5.

DETAILED DESCRIPTION OF THE PREFERRED EMBODIMENTS

The invention is directed to eliminating interference detected by a cable with an amplitude exceeding a particular threshold. In a first aspect, it concerns a connector disposed between a cable that can carry interfering signals and apparatus to be protected. In another aspect, it also concerns a cable assuring the protection function of itself.

FIG. 1 shows one example of use of a connector 10 in accordance with the invention.

The connector 10 is disposed between a cable subject to electromagnetic interference or jamming 12 and apparatus or equipment 13 to be protected. Although the connector 10 is shown outside the apparatus 13 it could obviously be inside the casing of the apparatus 13.

The cable 11 acts as a receive antenna for external waves 12. These interference waves can damage the terminal (transmit and/or receive) equipment 13 if they exceed an energy level, or voltage threshold, represented by the arrow $V_S$ at the input $13_1$.

The aim of the connector 10 is to eliminate the interference or to limit its amplitude to a voltage V less than $V_S$. The interference produces, at the end of the cable 11, an open circuit voltage $V_{CO}$ that is evidently greater than $V_S$, i.e. greater than the permissible voltage limit at the input $13_1$ of the equipment 13.

To eliminate the interference, the connector 10 (and/or the cable 11—see below) has a non-linear characteristic material disposed between the core and the outer conductor of the connector 10 (or the cable 11). By "non-linear characteristics" material is meant a material which is insulative for low values of electric field and which becomes conductive from a particular electric field threshold.

Under these conditions, if the electric field exceeds said threshold, i.e. if the interference exceeds a particular value, the interference is shunted to ground or dissipated in the material.

The non-linear behavior materials that can be used to effect this protection are, for example: a zwitterion or polymers such as a polyaniline, poly(N-phenyl p-phenylene diamine), a polythiophene, a polyarylthiophene, a polypyrrol, a polyarylvinylene, a poly(p-phenylene sulfide), a poly(p-phenylene), a paraphenylene vinylene, and copolymers and mixtures of these materials.

A self-doped copolymer can equally be used, selected from a copolymer of N-phenyl p-phenylene diamine and an amino-naphthalene sulfonic acid, a copolymer of aniline and an amino-naphthalene sulfonic acid, a copolymer of aniline and 3-(3-aminobenzyloxy)-1-propane sulfonic acid, a copolymer of aniline and 3-(2-aminophenoxy)-1-propane sulfonic acid, a copolymer of aniline and 4-(2-aminophenoxy)-1-butane sulfonic acid, a copolymer of aniline and 1-amino 2,6-bis (4-sulfobutoxy) benzene, and mixtures thereof.

The above polymers become conductive when the applied electric field exceeds about 3 kV/mm. This value is not suitable for all applications. This threshold is generally too high to protect most electronic terminal equipments.

This is why, in the preferred embodiment of the invention, to be described with reference to FIGS. 2 through 7, the spike effect is used to lower the threshold. The breakdown threshold can be reduced obtained by means of the spike effect by a factor between 10 and 100.

The connector 10 shown in FIG. 2 has a central conductor or core 15, an outer conductor 16 and the nonlinear characteristic material 17 between the core 15 and the conductor 16.

Given the protection function of the connector 10, it is necessary to provide a member 20 fastened to the outer conductor 16 for making the ground connection. This member 20 is of the type with a screw 21 and tag 22, for example.

The outer conductor 16 has a diameter in the order of 25 mm.

Each end of the connector 10 has a respective connection projection 19 and 20' that is part of the central conductor. These projections 19 and 20' are circular section cylinders.

The central conductor 15 has a plurality of sections $21_1$, $21_2$, $21_3$, etc between the projections 19 and 20' dividing the connector 10 into successive cells each of which has a particular input impedance. In this example, each odd cell ($21_1$, $21_3$, etc) has an input impedance of 6 ohms and each even cell ($21_2$, $21_4$, etc) has an input impedance of 60 ohms. The odd cells are all the same length whereas the lengths of the even cells vary. The aim of this division into cells is to enable filtering of interference at frequencies between 10 kHz and 18 GHz.

The odd sections $21_1$, $21_3$, etc of the core 15 have a maximum radius of 10.1 mm in this example and the even sections $21_2$, $21_4$, etc have a maximum radius of 2.8 mm.

To obtain the spike effect, i.e. a significant reduction in the breakdown threshold from the threshold of the material 17, the outer surface of the core forms at least one torus the section of which in a plane containing the axis 30 of the connector 10 terminates in two semicircles 31, 32 (FIG. 2) which in this example have a radius of 0.2 mm in the even sections and in the odd sections. FIG. 4 is a half-section showing the corrugations 31' of the core of an even cell.

Each section of the core 15 has several of these elements or disks. Accordingly, the outer surface of each section forms corrugations, each corrugation being a semicircle with a length of 0.4 mm parallel to the axis. Two successive semicircles 31 and 33 join at a re-entrant sharp edge 34 (34' in FIG. 4). The spike effect depends on the radius of curvature of the corrugations 31, 33, etc and their distance from the inside surface $16_1$ of the outer conductor 16. It also depends on the edge 34 (34') and its distance from the surface 16.

In the example shown in FIG. 2, it can be seen that the sections $21_1$ and $21_3$ have five corrugations, the section $21_2$ has two complete corrugations and one half-corrugation and the section $21_4$ has one corrugation and a portion of another corrugation.

In a variant embodiment (not shown), the corrugations or ribs are replaced with spiral ribs, with sharp edges, for example, these ribs being similar (or identical) to screwthreads.

A variant of the connector 10 will now be described with reference to FIGS. 5, 6, 7a and 7b. In these figures, components that are similar to components of the embodiment shown in FIGS. 2 to 4 are identified by the same reference numbers but generally primed (').

Only the components of this variant that differ significantly from those of the embodiment previously described will be described.

In this example, the spike effect is obtained by means of a polygonal, preferably a regular polygonal, cross-section of the core between the terminal projections 19' and 20'. In the example shown, the polygon has 12 sides.

The vertices 40, 41, etc (FIG. 6) of the polygon, i.e. the corresponding edges (parallel to the axis 30'), produce the required spike effect.

The electric field being locally increased near the edges 40, 41, 42, etc, these edges and their surroundings, in particular the dielectric 17', are subject to localized heating. Furthermore, unwanted electrical arcing can occur between these edges and the outer conductor. To limit this localized heating and, most importantly, to prevent electrical arcing, each section of the core is divided into a plurality of subsections so that two successive subsections have an angular offset about the axis 30' such that an edge of one subsection 54 (FIG. 7a) is not aligned with an edge of the next subsection 55 (FIG. 7b), but rather at equal distances from two neighboring edges of the adjacent section. In this example the angular offset between two successive subsections 54 and 55 is 150. This offset of 15° corresponds to half the angle that each side of the polygon subtends at the center 30' (FIG. 7a).

Accordingly, FIG. 7a shows that a vertex 41 of the subsection 54 lies between two vertices $40_1$ and $41_1$ of the next subsection 55 (in FIG. 7a the vertices $40_1$ and $41_1$ are not in the same plane as the vertex 41).

In this example, the section $21'_1$ is formed of two subsections 50 and 51 and the section $21'_2$ is formed of three subsections 54, 55 and 56. It can also be seen that another (even) subsection $21'_{16}$ is divided into five subsections.

The subsections with the same parity (i.e. odd or even) are the same length. This facilitates the production of the sections since each of them is then formed by the association of identical components.

In the examples described with reference to FIGS. 2 through 7 the spike effect for reducing the electric field threshold from which the material 17 is conductive is obtained by the configuration of the central conductor. In a variant (not shown), the spikes, i.e. the parts with a relatively small radius of curvature, are formed on the inside face of the outer conductor. There can also be spikes on the central conductor and on the outer conductor.

All the examples described hereinabove refer to a connector 10. It is nevertheless possible to produce a cable (not shown) incorporating the protection function of the invention. This cable conventionally has a core and an outer conductor separated by a dielectric material and, like the connector described hereinabove, incorporates in at least some portions a non-linear effect material, i.e. a material that is insulative for electric field values below a threshold and conductive for electric field values above this threshold.

In the case of a cable, it is also preferable to provide spike effect generator means to reduce the breakdown threshold of said material between the core and the outer conductor.

The spike effect is obtained by a configuration of the core and/or the outer conductor, preferably the configuration of the core. As for a connector, the central conductor has corrugations or a rib analogous to a screwthread or longitudinal edges (polygonal section).

If the threshold characteristic material is associated with an insulative layer, the protection effect is obtained at high frequencies by increasing the capacitance between the core and the conductor.

What is claimed is:

1. A device as for transmitting electrical energy or electrical signals comprising a core, an outer conductor and a dielectric material with an intrinsic breakdown threshold between said core and said outer conductor, wherein said dielectric material comprises, at least in part, a material that is insulative in an electric field below a particular threshold and conductive in an electric field exceeding said particular threshold, and the configuration of said core and said outer conductor is such that an external electric field threshold, for which said dielectric material becomes conductive, is significantly less than said intrinsic breakdown threshold of said dielectric material and wherein said dielectric material is an organic material comprising a self-doped copolymer selected from the group consisting of: a copolymer of N-phenyl p-phenylene diamine and an aminonaphthalene sulfonic acid, a copolymer of aniline and an aminonaphthalene sulfonic acid, a copolymer of aniline and 3-(3-aminobenzyloxy)-1-propane sulfonic acid, a copolymer of aniline and 3-(2-aminophenoxy)-1-propane sulfonic acid, a copolymer of aniline and 4-(2-aminophenoxy)-1-butane sulfonic acid, a copolymer of aniline and 1-amino 2,6-bis (4-sulfobutoxy) benzene, and mixtures thereof.

2. The device as claimed in claim 1, wherein said core and said outer conductor have a configuration with spikes for locally increasing the electric field.

3. The device as caimed in claim 2, wherein said core has, in section on an axial plane, at least one corrugation or rib with a radius of curvature or radii of curvature producing a spike effect.

4. The device as claimed in claim 3, wherein said core has an outer surface formed of tori which have a section in an axial plane formed of a plurality of semi-circles.

5. The device as claimed in claim 4, wherein all said semi-circles have the same radius.

6. The device as claimed in claim 2, wherein said core has an axis and edges parallel to said axis.

7. The device as claimed in claim 6, wherein said core has an axis and a polygon-shape cross-section perpendicular to said axis.

8. The device as claimed in claim 7, wherein said polygon is a regular polygon.

9. The device as claimed in claim 8, wherein said polygon has 12 sides.

10. The device as claimed in claim 6, wherein said core has an axis and identical elements in succession which are offset angularly about said axis so that each edge of each of said elements is in an intermediate angular position between angular positions of two edges of another of said elements.

11. The device as claimed in claim 10, wherein said polygon is a regular polygon and said intermediate angular position is equal to half an angle subtended by one side of said polygon at a center.

12. A device as claimed in claim 1 including means for connecting said outer conductor to ground.

13. A device as claimed in claim 1 wherein said device as is a connector adapted to be disposed between a cable and an input of protected equipment to be protected against interference emanating from said cable.

14. A device as claimed in claim 1 wherein said device as is a cable.

* * * * *